(12) United States Patent
Wei et al.

(10) Patent No.: US 11,317,504 B2
(45) Date of Patent: *Apr. 26, 2022

(54) ELECTRONIC ASSEMBLY

(71) Applicant: Shanghai Zhaoxin Semiconductor Co., Ltd., Shanghai (CN)

(72) Inventors: Yu-Chieh Wei, New Taipei (TW); Yen-Chen Chen, New Taipei (TW); Yu-Ching Hung, New Taipei (TW)

(73) Assignee: Shanghai Zhaoxin Semiconductor Co., Ltd., Shanghai (CN)

( * ) Notice: Subject to any disclaimer, the term of this patent is extended or adjusted under 35 U.S.C. 154(b) by 0 days.

This patent is subject to a terminal disclaimer.

(21) Appl. No.: 16/985,247

(22) Filed: Aug. 5, 2020

(65) Prior Publication Data

US 2021/0378095 A1 Dec. 2, 2021

(30) Foreign Application Priority Data

Jun. 2, 2020 (TW) ................................ 109118384
Jul. 7, 2020 (CN) ......................... 202010645263.3

(51) Int. Cl.
*H05K 1/02* (2006.01)
*H05K 1/11* (2006.01)
(Continued)

(52) U.S. Cl.
CPC ........... *H05K 1/0228* (2013.01); *H05K 1/115* (2013.01); *H05K 1/116* (2013.01); *H05K 1/181* (2013.01);
(Continued)

(58) Field of Classification Search
CPC ....................... H05K 1/116; H05K 2201/10159
See application file for complete search history.

(56) References Cited

U.S. PATENT DOCUMENTS 9,958,897 B1 * 5/2018 Maroney .................. G06F 1/16
11,083,078 B1 * 8/2021 Wei ......................... H05K 1/181
(Continued)

FOREIGN PATENT DOCUMENTS

CN  112074080    12/2020
TW  I661521     6/2019

OTHER PUBLICATIONS

"Office Action of Taiwan Counterpart Application", dated Sep. 3, 2021, p. 1-p. 7.

*Primary Examiner* — Ishwarbhai B Patel
(74) *Attorney, Agent, or Firm* — JCIPRNET

(57) ABSTRACT

An electronic assembly is provided, including a wiring board, a control element, and a pair of first internal electrical connectors. The wiring board includes a mounting surface, a first patterned conductive layer, a plurality of second patterned conductive layers, a plurality of near conductive holes, a plurality of far conductive holes, and a first conductive path. The first patterned conductive layer is located between the mounting surface and the second patterned conductive layers. The control element is mounted on the mounting surface of the wiring board. The pair of first internal electrical connectors are mounted on the mounting surface of the wiring board, and are adapted for mounting a pair of memory modules. The first conductive path extends from the control element at least through the corresponding second patterned conductive layer and the first patterned conductive layer to the pair of first internal electrical connectors.

18 Claims, 18 Drawing Sheets

(51) Int. Cl.
*H05K 1/18* (2006.01)
*H01R 12/73* (2011.01)
(52) U.S. Cl.
CPC .......... *H01R 12/737* (2013.01); *H05K 1/111* (2013.01); *H05K 2201/09227* (2013.01); *H05K 2201/09236* (2013.01); *H05K 2201/09609* (2013.01); *H05K 2201/10159* (2013.01); *H05K 2201/10189* (2013.01); *H05K 2201/10522* (2013.01)

(56) References Cited

U.S. PATENT DOCUMENTS

| | | | |
|---|---|---|---|
| 2005/0028038 A1* | 2/2005 | Pomaranski | G06F 11/2268 714/42 |
| 2005/0270875 A1* | 12/2005 | Saeki | G06F 13/1684 365/222 |
| 2010/0067278 A1* | 3/2010 | Oh | G11C 5/02 365/51 |
| 2019/0132951 A1 | 5/2019 | Barnette et al. | |
| 2020/0163204 A1 | 5/2020 | Kim et al. | |
| 2020/0393787 A1 | 12/2020 | Numagi et al. | |

\* cited by examiner

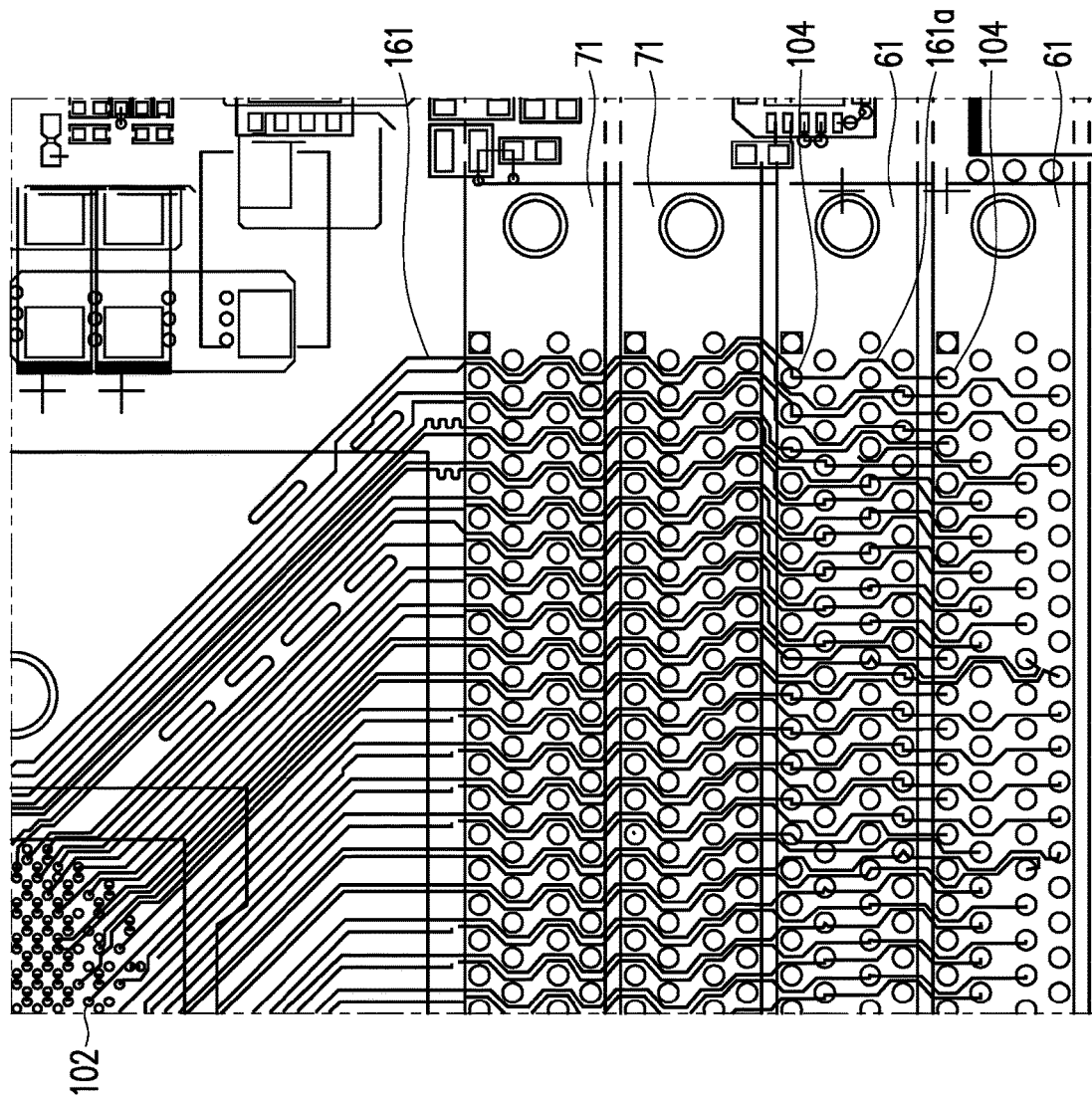

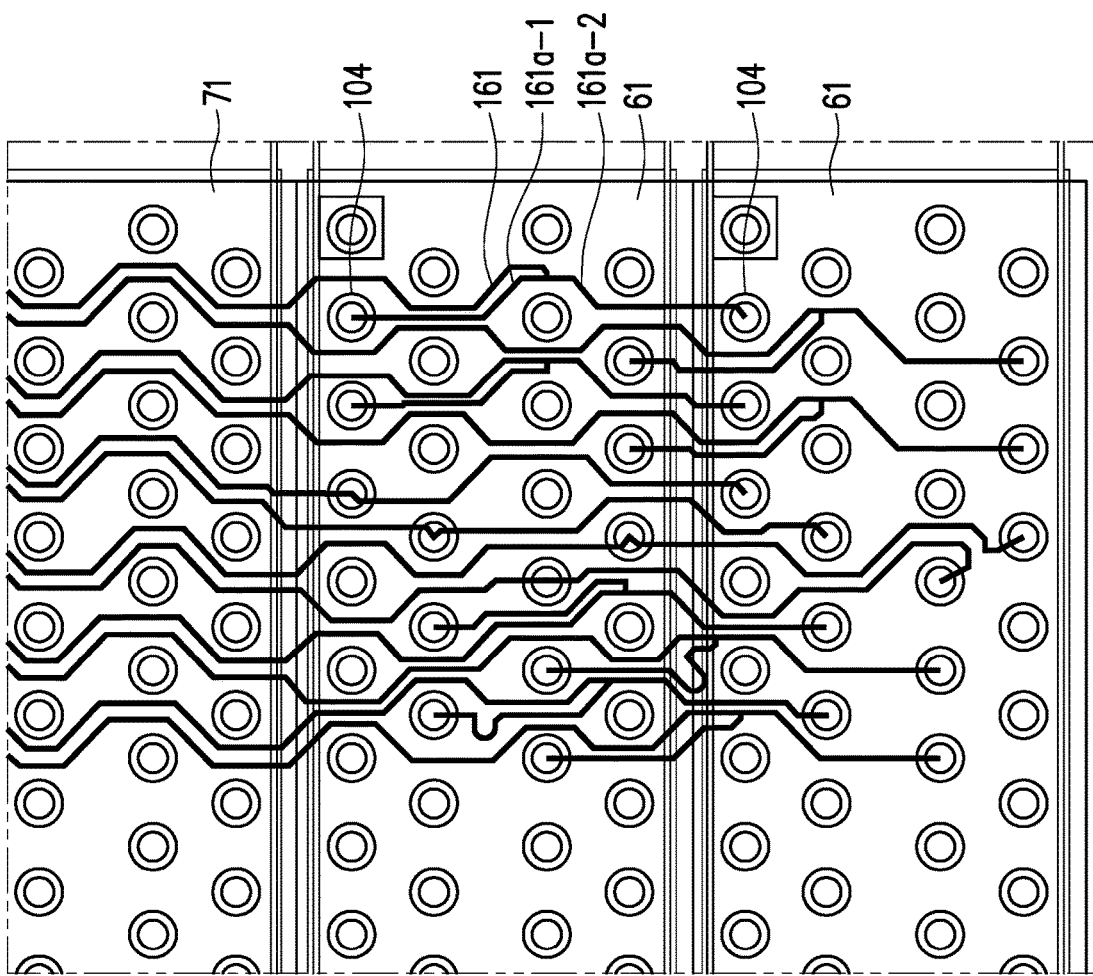

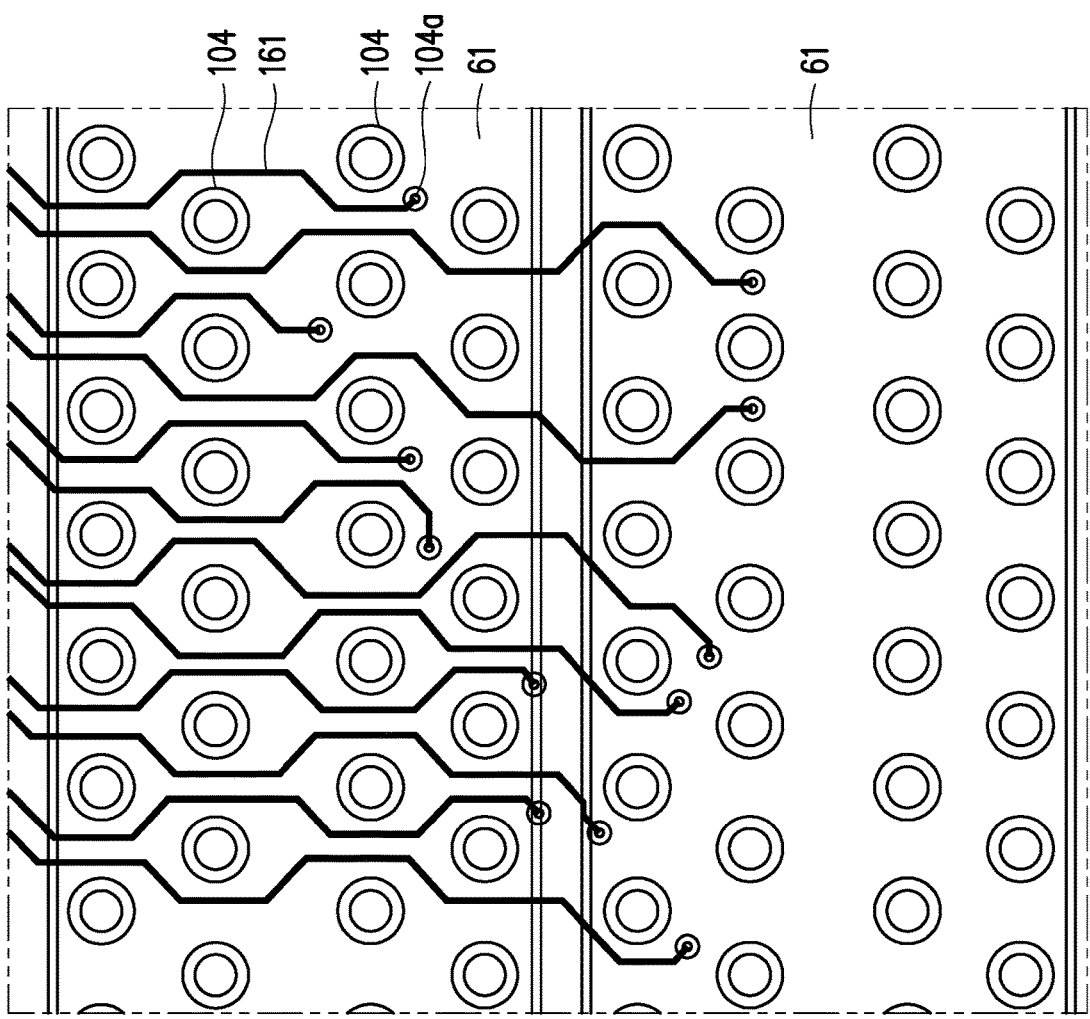

US 11,317,504 B2

ELECTRONIC ASSEMBLY

CROSS-REFERENCE TO RELATED APPLICATION

This application claims the priority benefit of Taiwan application no. 109118384, filed on Jun. 2, 2020 and China application no. 202010645263.3, filed on Jul. 7, 2020. The entirety of each of the above-mentioned patent applications is hereby incorporated by reference herein and made a part of this specification.

BACKGROUND OF THE DISCLOSURE

1. Field of the Disclosure

The disclosure relates to an electronic assembly, and in particular, to an electronic assembly including a wiring board and an electronic element mounted thereon.

2. Description of Related Art

A memory unit is one of constituting units of a computer. A main memory of the memory unit includes a random access memory (RAM), such as a static random access memory (SRAM) and a dynamic random access memory (DRAM). For a dual in-line memory module (DIMM) constituted by the dynamic random access memory (DRAM), signal wiring between a control element (such as a central processing unit (CPU) or a control die, etc.) and such memory module is usually connected to two memory modules by using a die output channel. Such memory module usually includes a module board and two ranks of memory dies. The two ranks of memory dies are mounted to both sides of the module board, respectively. Such memory module is usually made into a card type, and is mounted to a wiring board through a slot-type electrical connector, so that an electrical connection is achieved between the memory module and the control element mounted on the wiring board through wiring within the wiring board.

SUMMARY OF THE DISCLOSURE

The disclosure provides an electronic assembly configured to improve flexibility of wiring.

An electronic assembly of the disclosure includes a wiring board, a control element, and a pair of first internal electrical connectors. The wiring board includes a mounting surface, a first patterned conductive layer, a plurality of second patterned conductive layers, a plurality of near conductive holes, a plurality of far conductive holes, and a first conductive path. The first patterned conductive layer is located between the mounting surface and the second patterned conductive layers. The control element is mounted on the mounting surface of the wiring board. The pair of first internal electrical connectors are mounted on the mounting surface of the wiring board, and are adapted for mounting a pair of memory modules. The first conductive path extends from the control element through at least the corresponding second patterned conductive layer and the first patterned conductive layer to the pair of first internal electrical connectors.

Based on the foregoing, according to the disclosure, the conductive path extends through a patterned conductive layer, and then continuously extends through another different patterned conductive layer to improve elasticity of the wiring.

BRIEF DESCRIPTION OF THE DRAWINGS

FIG. 1B shows wiring of a patterned conductive layer L8 of a wiring board of FIG. 1A.
FIG. 6B shows wiring of a patterned conductive layer L8 of a wiring board of FIG. 6A.
FIG. 7B shows wiring of a patterned conductive layer L8 of a wiring board of FIG. 7A.

DESCRIPTION OF THE EMBODIMENTS

Figure 1A:
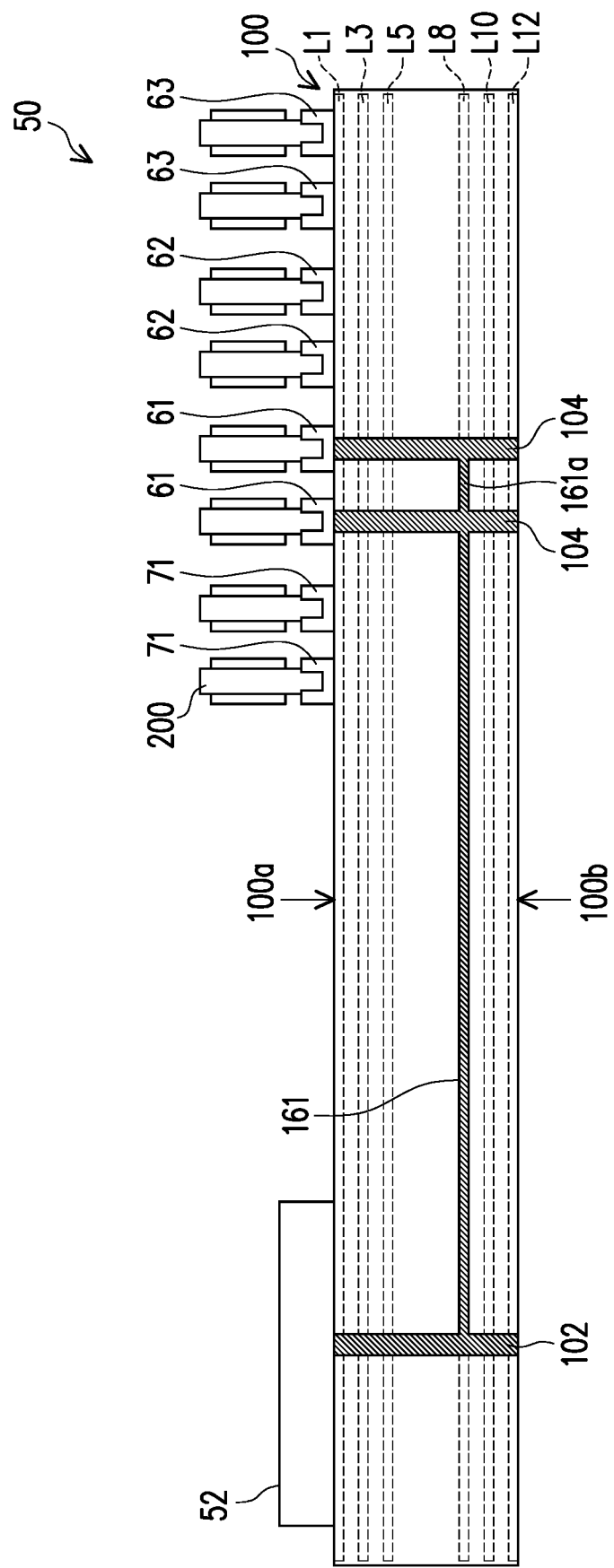
FIG. 1A is a schematic diagram of an electronic assembly related to the disclosure.

Signal wiring between a central processing unit (CPU) or a die and a dual in-line memory module (DIMM) composed of a dynamic random access memory (DRAM) is mostly connected to two memory modules by using a die output channel.

A routing topology on a wiring board is divided into an unequidistant daisy chain topology and an equidistant T-type topology. In wiring of a daisy chain topology, a plurality of devices are connected to each other in sequence or in a ring, that is, the plurality of devices are connected to a near first memory module, and then connected to a far second memory module. In wiring of the T-type topology, wiring is first performed at a middle position of two memory modules, and then the plurality of devices are connected to the two memory modules equidistantly.

Signals are transmitted to two memory modules through the daisy chain topology at different time, while signals are transmitted to the two memory modules through the T-type topology at the same time. Therefore, quality of the signal transmitted to a far memory module through the daisy chain topology is better that quality of the signal transmitted to a near memory module, while quality of the signals transmitted to the two memory modules through the T-type topology is similar.

In terms of wiring of the daisy chain topology, the plurality of devices are connected to a through hole of a first memory module connector, and a trace is branched at this connection point for the plurality of devices to be connected to a through hole of a second memory module connector. In terms of the wiring of the T-type topology, wiring is first performed at a middle position of two memory modules, and at this position, two traces are branched for the plurality of devices to be equidistantly connected to the through holes of the two memory module connectors.

In the daisy chain topology and the T-type topology, a trace after a branch point is maintained at a same layer as a trace before the branch point. Therefore, a wiring path after the branch point is connected to two memory modules by using through holes of the two memory module connectors, respectively. The through hole through the connector increases coupling noise between signals.

For the T-type topology, wiring needs to be performed at the middle position through the first memory module, and then returns to the through hole of the first memory module connector. Therefore, for each signal, a gap between a through hole of the memory module connectors must accommodate an additional rewound signal wiring. This causes a gap between the signals to be narrowed, and the coupling noise between the signals to be increased.

For signals routed on an inner layer of the wiring board, the trace after the branch point and the trace before the branch point are maintained at a same layer, so that a wiring distance after the branching is too long, causing a rise waveform or a fall waveform to be delayed, affecting the signal quality.

In the disclosure, the branch point in a pair of multi-electronic element connection topologies on the wiring board and a trace after the branch point is moved to a layer closest to the electronic element to shorten a wiring distance after the branch point, thereby reducing an effect caused by a residual section. In addition, a number of through holes on a path may be reduced to decrease the coupling noise. In the meantime, in use of the T-type topology, increase of coupling due to signals crowded on the same layer or even a lack of space may be prevented, thereby causing the T-type topology to be more possibly implemented. Therefore, especially for a signal in high-speed transmission, signal quality may be improved, and a working range may be expanded.

Detailed descriptions are given through a plurality of embodiments in combination with drawings in the following.

Referring to FIG. 1A and FIG. 1B, an electronic assembly 50 related to the disclosure includes a wiring board 100, a control element 52, and a pair of first internal electrical connectors 61. The wiring board 100 includes a mounting surface 100a, an outer patterned conductive layer (a first patterned conductive layer) L1, a plurality of inner patterned conductive layers (second patterned conductive layers) L3, L5, L8, L10, a plurality of near conductive holes 102, a plurality of far conductive holes 104, and a first conductive path 161. The outer patterned conductive layer L1 is located between the mounting surface 100a and the inner patterned conductive layers L3, L5, L8, L10. The control element 52 is mounted on the mounting surface 100a of the wiring board. The pair of first internal electrical connectors 61 are mounted on the mounting surface 100a of the wiring board, and are adapted for mounting a pair of memory modules 200. In FIG. 1A, the first conductive path 161 extends from the control element 52 through a corresponding near conductive hole 102 to a corresponding inner patterned conductive layer L8, and through the corresponding far conductive hole 104 to the pair of first internal electrical connectors 61. The pair of first internal electrical connectors 61 include corresponding far conductive holes 104, respectively. The two far conductive holes 104 are electrically connected to each other with a trace 161a (that is, a part of the first conductive path 161) in the inner patterned conductive layer L8, as shown in FIG. 1B.

The control element 52 is, for example, a central processing unit or a control die. The first internal electrical connector 61 is, for example, a slot-type electrical connector configured to be combined with a card-type dual in-line memory module 200. In addition, similar examples are further used in all the electrical connectors in this embodiment and the following embodiments. In such example, the far conductive hole 104 is, for example, a conductive through hole. The conductive through hole may allow a pin of the electrical connector to pass through and be soldered with the pin to mount the electrical connector on the wiring board 100.

Figure 2A:
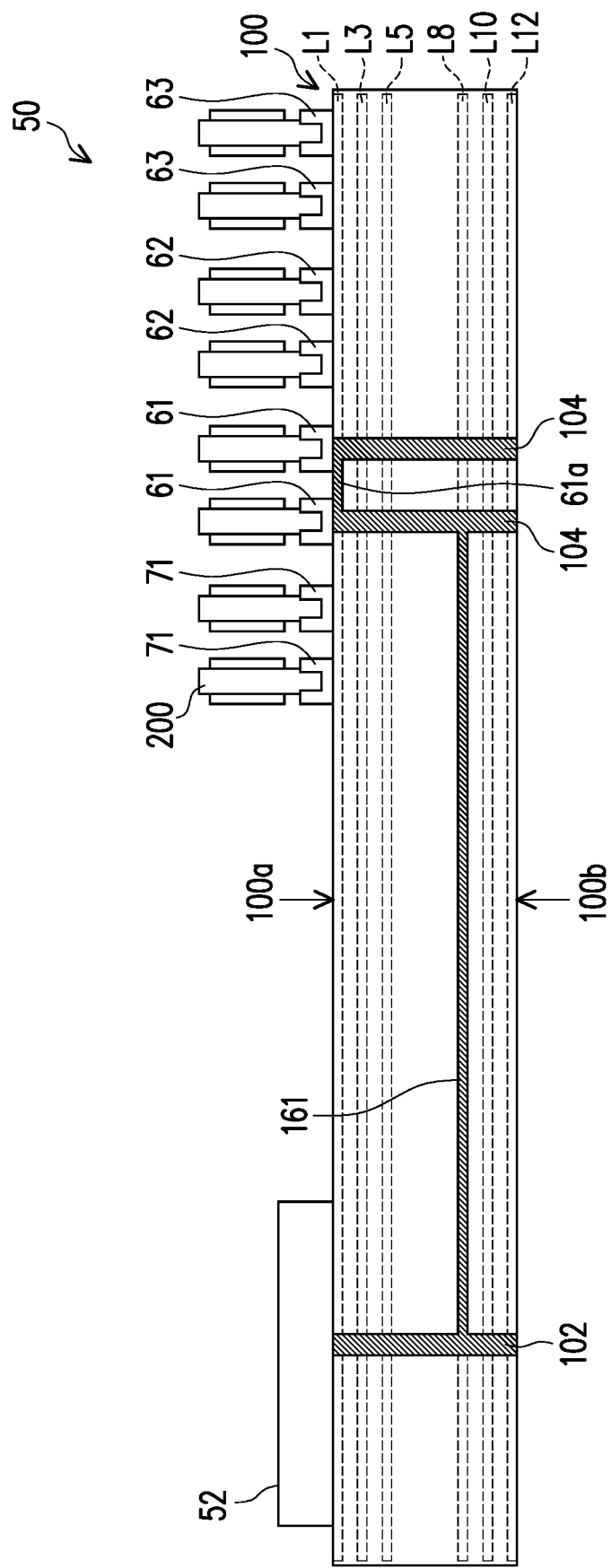
FIG. 2A is a schematic diagram of an electronic assembly according to another embodiment of the disclosure.
Figure 2B:
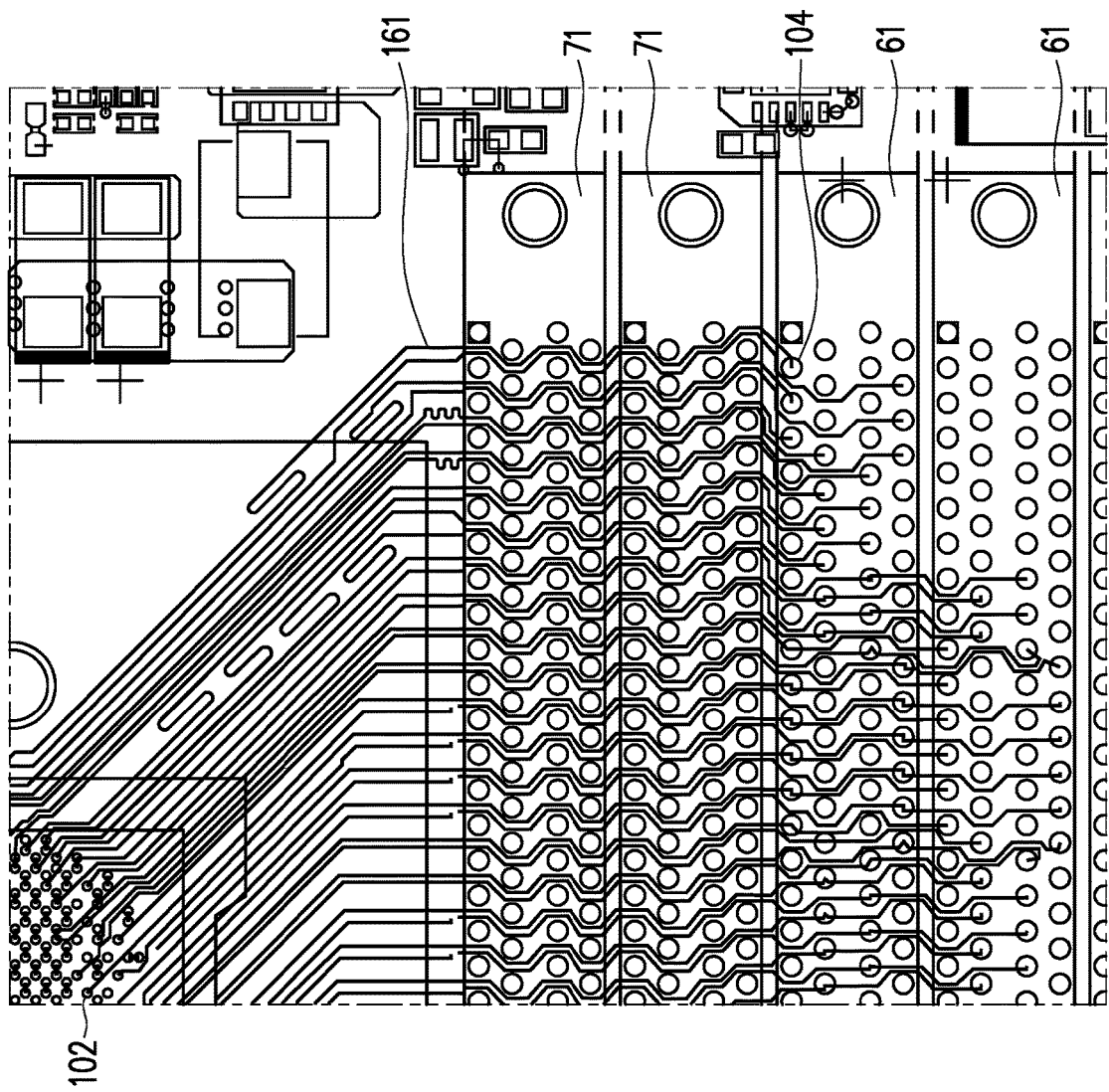
FIG. 2B shows wiring of a patterned conductive layer L8 of a wiring board of FIG. 2A.
Figure 2C:
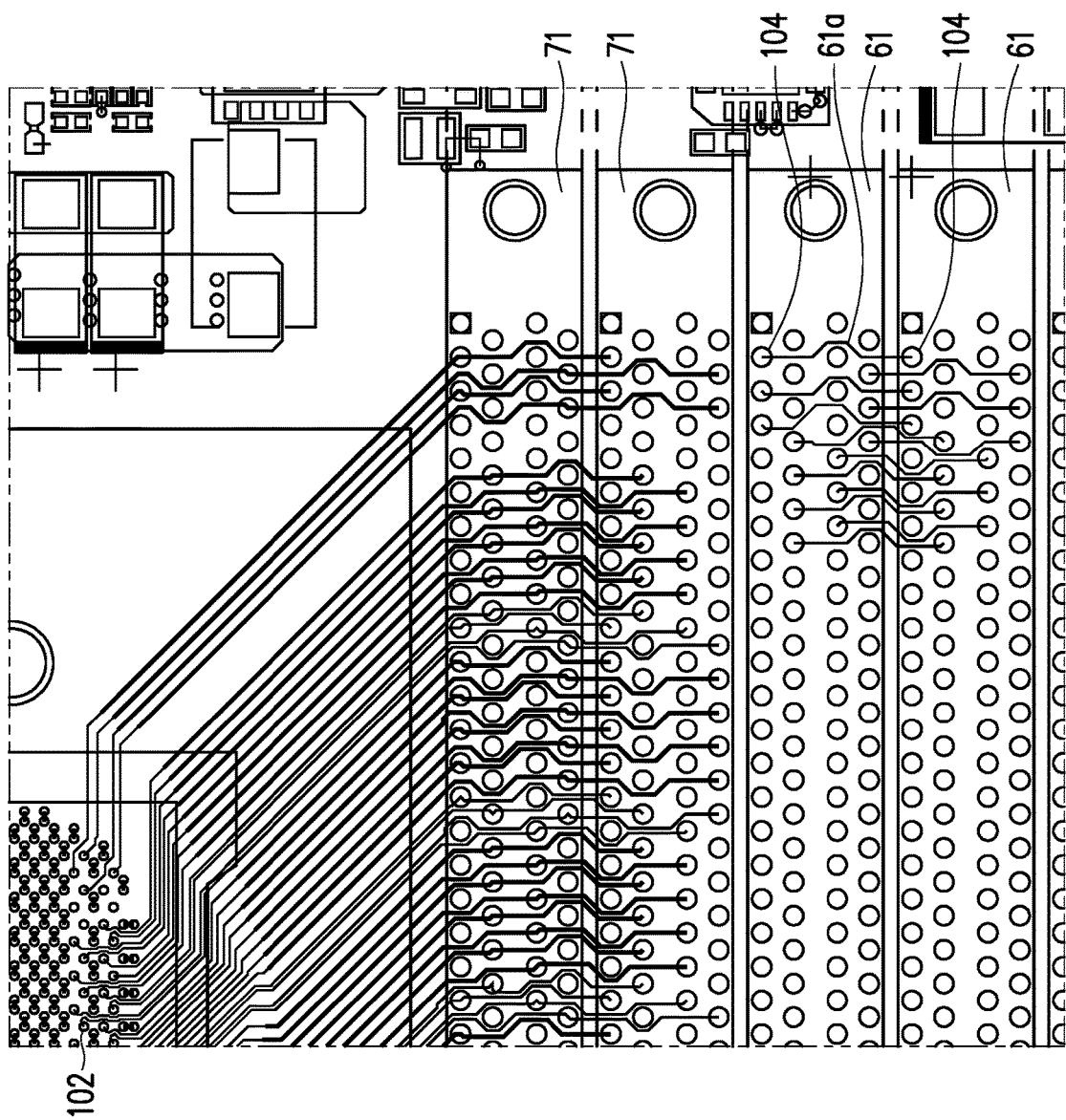
FIG. 2C shows wiring of an outer patterned conductive layer L1 of the wiring board of FIG. 2A.
Figure 2D:
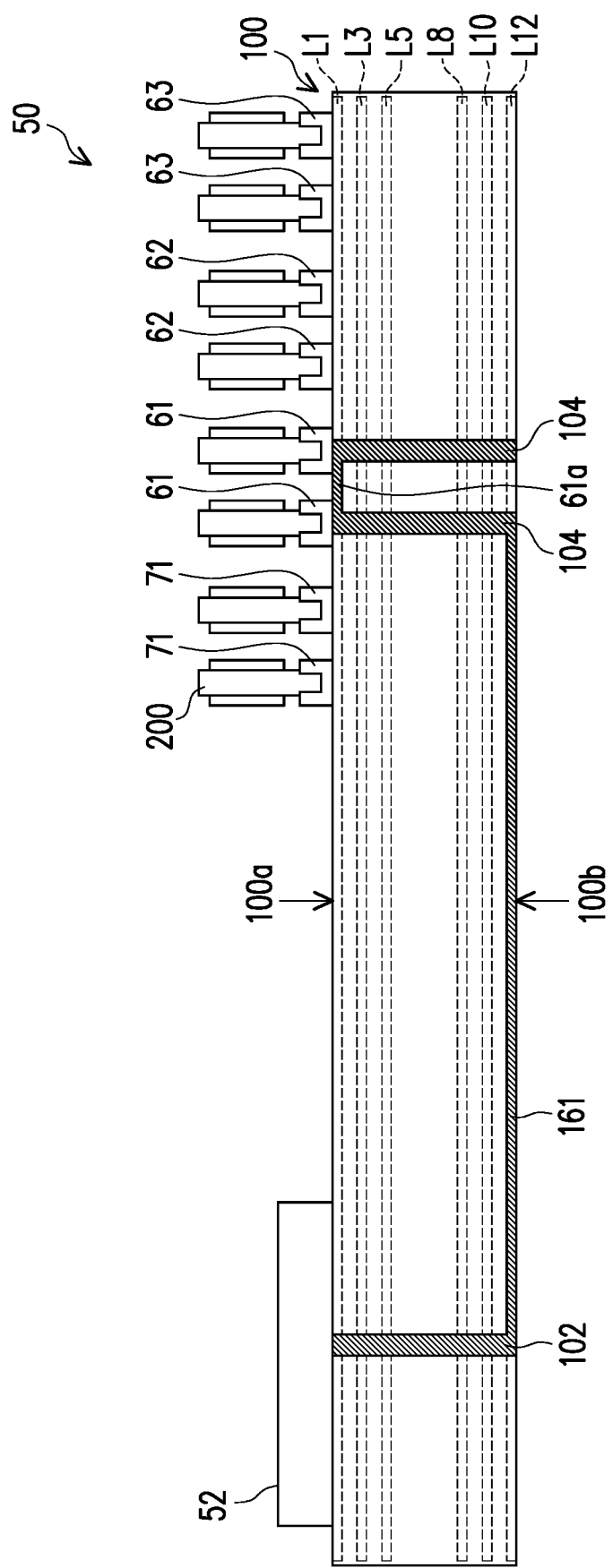
FIG. 2D is a schematic diagram of an electronic assembly according to another embodiment of the disclosure.

Referring to FIG. 2A, FIG. 2B and FIG. 2C, compared to the embodiment of FIG. 1A, in this embodiment, a first conductive path 161 extends from a control element 52 through a corresponding near conductive hole 102 to a corresponding inner patterned conductive layer L8, and through a corresponding far conductive hole 104 and an outer patterned conductive layer L1 to the pair of first internal electrical connectors 61. In other words, the first conductive path 161 achieves signal transmission through the inner patterned conductive layer L8 and the outer patterned conductive layer L1 (that is, two different patterned conductive layers). In this embodiment, the pair of first internal electrical connectors 61 have corresponding far conductive holes 104, respectively, and the two far conductive holes 104 are electrically connected to each other with a trace 61a in the outer patterned conductive layer L1, as shown in FIG. 2C. In addition, compared to FIG. 1B, an inner patterned conductive layer L8 of FIG. 2B is disposed between adjacent far conductive holes 104 without wiring. In this embodiment, a daisy chain topology is used in the first conductive path 161, that is, the first conductive path 161 extends through the corresponding far conductive hole 104 to one of the pair of first internal electrical connectors 61, and then through a trace 61a of the outer patterned conductive layer L1 to the other of the pair of first internal electrical connectors 61. In addition, in other embodiments as shown in FIG. 2D, the wiring board 100 further includes a bottom surface 100b and a bottom patterned conductive layer (a second patterned conductive layer) L12 relative to the mounting surface 100a. Inner patterned conductive layers L3, L5, L8, L10 are located between the outer patterned conductive layer L1 and the bottom patterned conductive layer L12. The first conductive path 161 extends from the control element 52 through the corresponding near conductive hole 102 to the corresponding bottom patterned conductive layer L12, and through the corresponding far conductive hole 104 and the outer patterned conductive layer L1 to the pair of first internal electrical connectors 61, as shown in FIG. 2D. In other words, the first conductive path 161 achieves signal transmission through two different patterned conductive layers.

Figure 3:
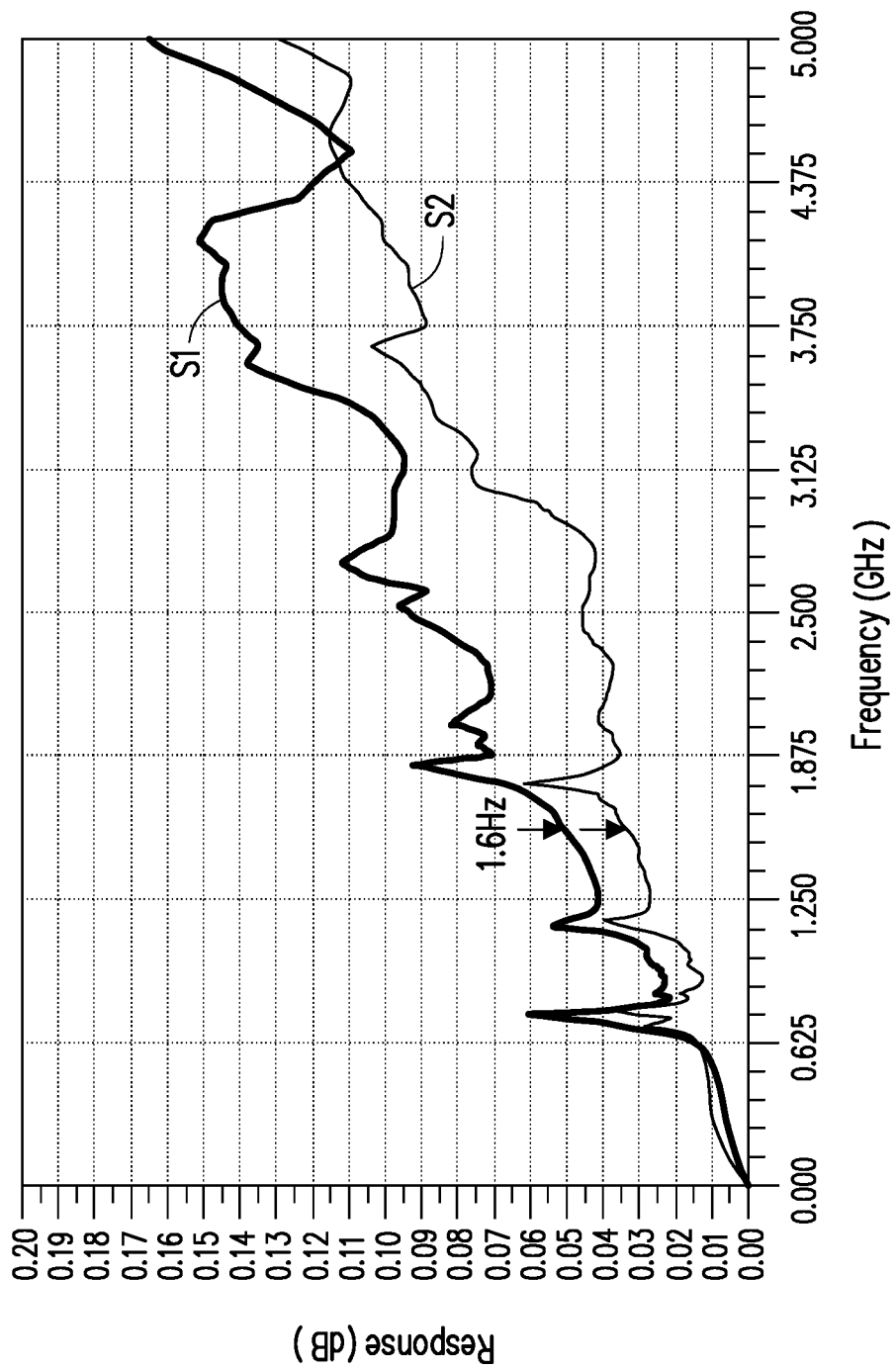
FIG. 3 is a curve graph of frequency response of a far-end coupling noise.

Referring to FIG. 3, a curve graph of frequency response of a far-end coupling noise is shown. Under same simulation test parameters, a coupling noise curve S2 of the first conductive path 161 of the electronic assembly 50 of FIG. 2A is lower than a coupling noise curve S1 of the first conductive path 161 of the electronic assembly 50 of FIG. 1A. This represents that the electronic assembly 50 of FIG. 2A has better signal transmission quality.

Figure 4:
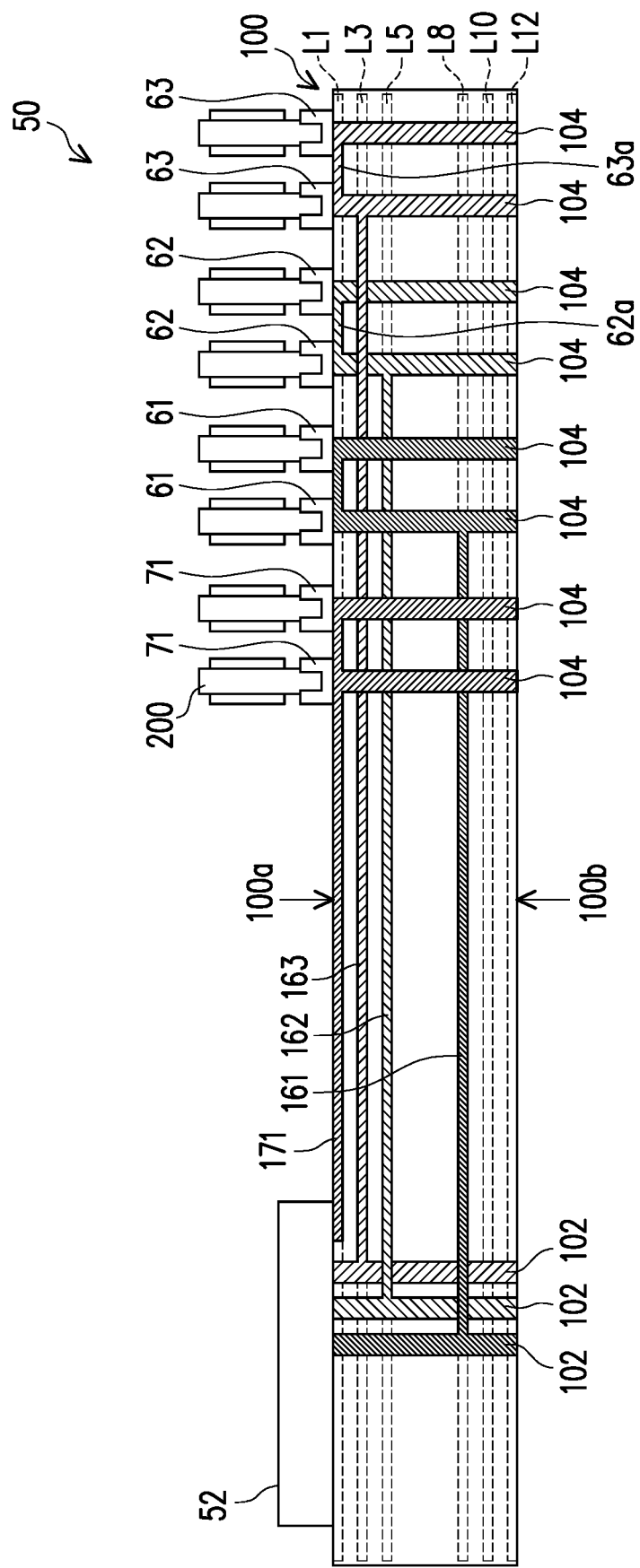
FIG. 4 is a schematic diagram of an electronic assembly according to still another embodiment of the disclosure.

Referring to FIG. 4, compared to the electronic assembly of FIG. 2A, an electronic assembly 50 further includes a pair of second internal electrical connectors 62 mounted on a mounting surface 100a of a wiring board and adapted for mounting a pair of memory modules 200. The wiring board 100 further includes a second conductive path 162. The second conductive path 162 extends from a control element 52 through a corresponding near conductive hole 102 to a corresponding inner patterned conductive layer L5, and through a corresponding far conductive hole 104 and a trace 62a of an outer patterned conductive layer L1 to the pair of second internal electrical connector 62. The pair of second internal electrical connectors 62 are farther from a control element 52 than the pair of first internal electrical connectors 61. It should be noted that a corresponding inner patterned conductive layer L5 through which the second conductive path 162 passes is different from a corresponding inner patterned conductive layer L8 through which the first conductive path 161 passes.

In this embodiment, the corresponding inner patterned conductive layer L5 through which the second conductive path 162 passes is closer to the outer patterned conductive layer L1 than the corresponding inner patterned conductive layer L8 through which the first conductive path 161 passes. In other words, compared to the pair of first internal electrical connectors 61 closer to the control element 52, the pair of second internal electrical connectors 62 farther from the control element 52 have a greater tolerance to signal interference, and the second conductive path 162 corresponding to the pair of second internal electrical connectors may be disposed on the inner patterned conductive layer L5 closer to the outer patterned conductive layer L1.

In this embodiment, a daisy chain topology is also used in the second conductive path 162. The second conductive path 162 extends through a corresponding far conductive hole 104 to one of the pair of second internal electrical connectors 62, and then through the trace 62a of the outer patterned conductive layer L1 to the other of the pair of second internal electrical connectors 62.

In this embodiment, the electronic assembly 50 further includes a pair of third internal electrical connectors 63 mounted on the mounting surface 100a of the wiring board and adapted for mounting a pair of memory modules 200. The wiring board 100 further includes a third conductive path 163. The third conductive path 163 extends from a control element 52 through a corresponding near conductive hole 102 to a corresponding inner patterned conductive layer L3, and through a corresponding far conductive hole 104 and a trace 63a of an outer patterned conductive layer L1 to the pair of third internal electrical connector 63. The pair of third internal electrical connectors 63 are farther from the control element 52 than the pair of first internal electrical connectors 61.

In this embodiment, a corresponding inner patterned conductive layer L3 through which the third conductive path 163 passes is closer to the outer patterned conductive layer L1 than the inner patterned conductive layer L8 through which the first conductive path 161 passes and the corresponding inner patterned conductive layer L5 through which the second conductive path 162 passes. In other words, because a pair of internal electrical connectors (for example, the pair of third internal electrical connectors 63) farther from the control element 52 have a greater tolerance to signal interference, a conductive path corresponding to the pair of internal electrical connectors may be configured in an inner patterned conductive layer (for example, the inner patterned conductive layer L3) closer to the outer patterned conductive layer L1.

In this embodiment, a daisy chain topology is also used in the third conductive path 163. The third conductive path 163 extends through a corresponding far conductive hole 104 to one of the pair of third internal electrical connectors 63, and then through the trace 63a of the outer patterned conductive layer L1 to the other of the pair of third internal electrical connectors 63.

In this embodiment, the electronic assembly 50 further includes a pair of external electrical connectors 71. The pair of external electrical connectors 71 are mounted on the mounting surface 100a of the wiring board, and is adapted for mounting a pair of memory modules 200. The wiring board 100 further includes an outer conductive path 171. The outer conductive path 171 extends from the control element 52 through the outer patterned conductive layer L1 to the pair of external electrical connectors 71. The pair of external electrical connectors 71 are closer to the control element 52 than the pair of first internal electrical connectors 61.

In this embodiment, a daisy chain topology is also used in the outer conductive path 171. The outer conductive path 171 extends through the outer patterned conductive layer L1 to one of the pair of external electrical connectors 71, and then through the outer patterned conductive layer L1 to the other of the pair of external electrical connectors 71.

Figure 5:
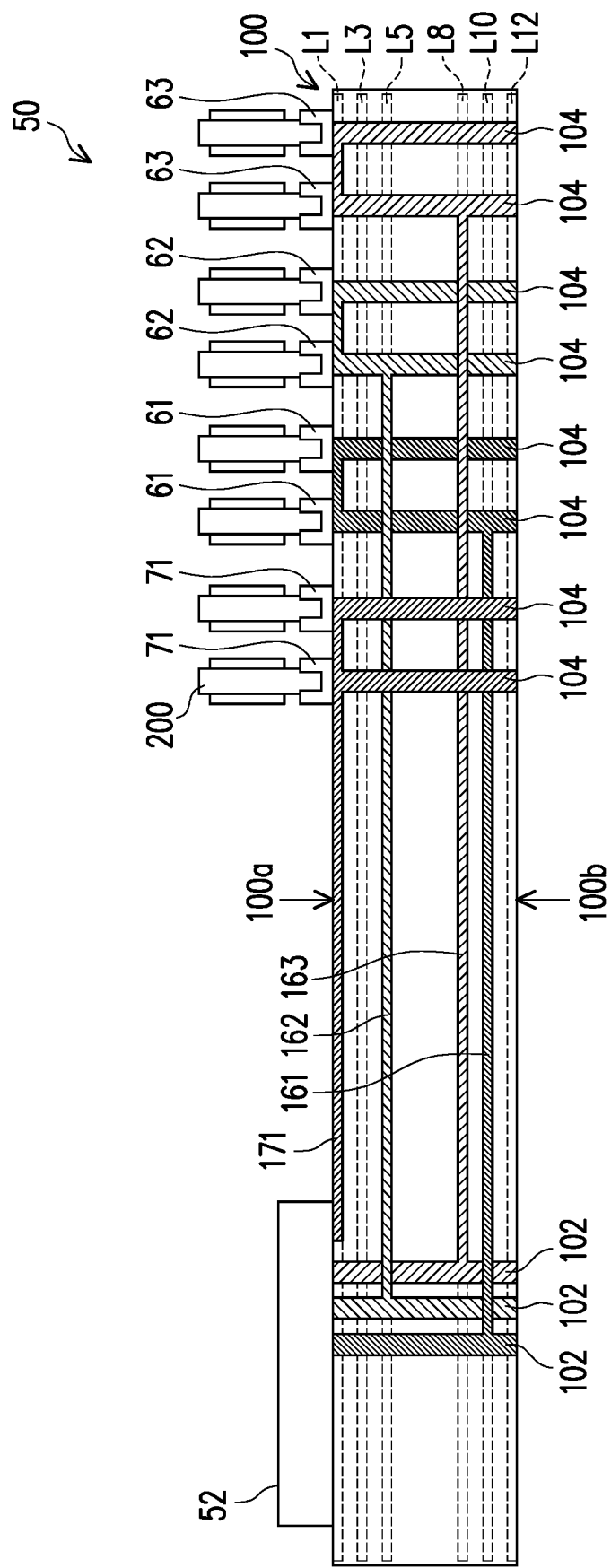
FIG. 5 is a schematic diagram of an electronic assembly according to yet still another embodiment of the disclosure.

Referring to FIG. 5, compared to the embodiment of FIG. 4, in this embodiment, a corresponding inner patterned conductive layer L8 through which a third conductive path 163 of a pair of third internal electrical connectors 63 passes is farther from an outer patterned conductive layer L1 than a corresponding inner patterned conductive layer L3 through which a second conductive path 162 passes, and the corresponding inner patterned conductive layer L8 through which the third conductive path 163 of the pair of third internal electrical connectors 63 passes is closer to the outer patterned conductive layer L1 than a corresponding inner patterned conductive layer L10 through which a first conductive path 161 passes. Because the pair of second internal electrical connectors 62 and the pair of third internal electrical connectors 63 are farther from the control element 52 and have a greater tolerance to signal interference, in some cases, a number of the inner patterned conductive layers at which a conductive path thereof is located may be adjusted flexibly. However, compared to the pair of first internal electrical connectors 61 closer to the control element 52, a number of the inner patterned conductive layers at which a conductive path thereof is located needs to be farther from the outer patterned conductive layer L1.

Figure 6A:
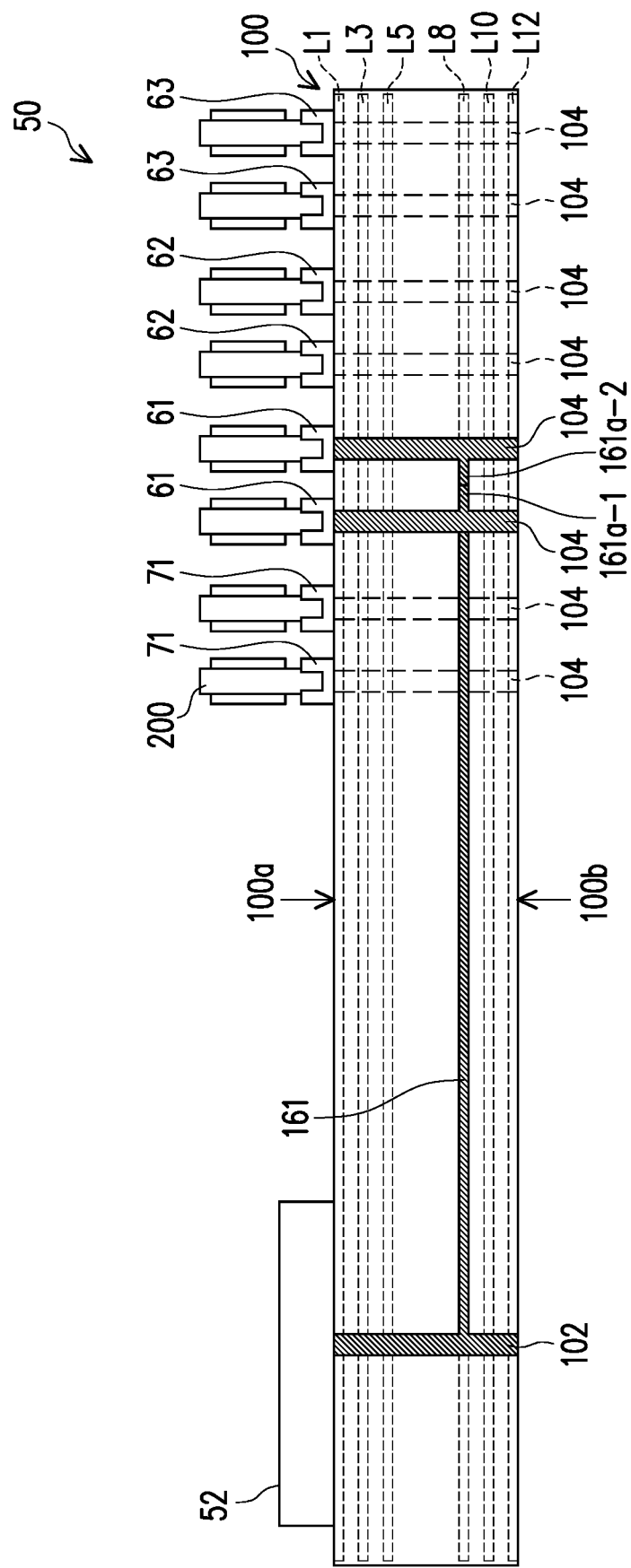
FIG. 6A is a schematic diagram of another electronic assembly related to the disclosure.

Referring to FIG. 6A and FIG. 6B, an electronic assembly 50 related to the disclosure includes a wiring board 100, a control element 52, and a pair of first internal electrical connectors 61. The wiring board 100 has a mounting surface 100a, an outer patterned conductive layer L1, a plurality of inner patterned conductive layers L3, L5, L8, L10, a plurality of near conductive holes 102, a plurality of far conductive holes 104, and a first conductive path 161. The outer patterned conductive layer L1 is located between the mounting surface 100a and the inner patterned conductive layers L3, L5, L8, L10. The control element 52 is mounted on the mounting surface 100a of the wiring board. The pair of first internal electrical connectors 61 are mounted on the mounting surface 100a of the wiring board, and are adapted for mounting a pair of memory modules 200. In FIG. 6A, the first conductive path 161 extends from the control element 52 through the corresponding near conductive hole 102 to a corresponding inner patterned conductive layer L8, and branches through the corresponding inner patterned conductive layer L8 and extends at equidistant traces 161a-1, 161a-2 to a pair of corresponding far conductive holes 104 (as shown in FIG. 6B), and then extends through the pair of corresponding far conductive holes 104 to the pair of first internal electrical connectors 61.

The control element 52 is, for example, a central processing unit or a control die. The first internal electrical connector 61 is, for example, a slot-type electrical connector configured to be combined with a card-type dual in-line memory module 200. In addition, similar examples are further used in all the electrical connectors in this embodiment and the following embodiments. In such example, the far conductive hole 104 is, for example, a conductive through hole. The conductive through hole may allow a pin of the electrical connector to pass through and be soldered with the pin to mount the electrical connector on the wiring board 100.

Figure 7A:
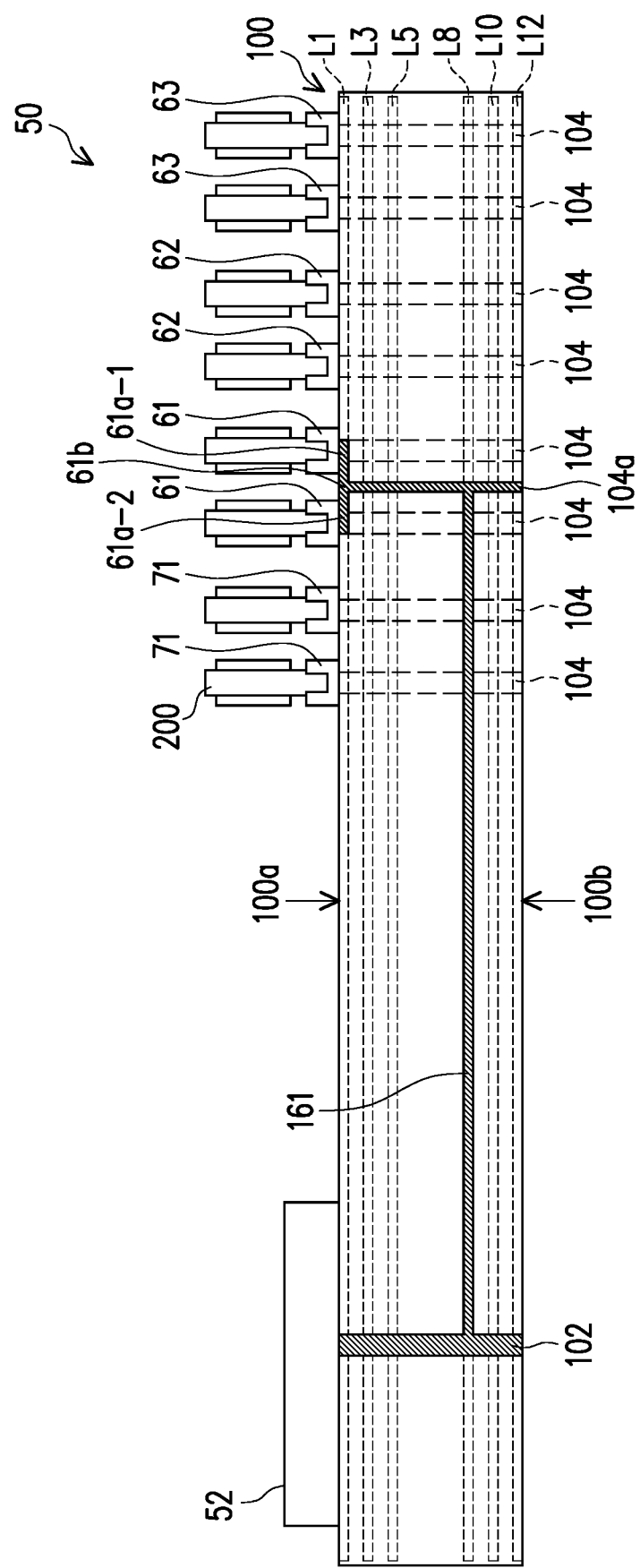
FIG. 7A is a schematic diagram of an electronic assembly according to another embodiment of the disclosure.
Figure 7C:
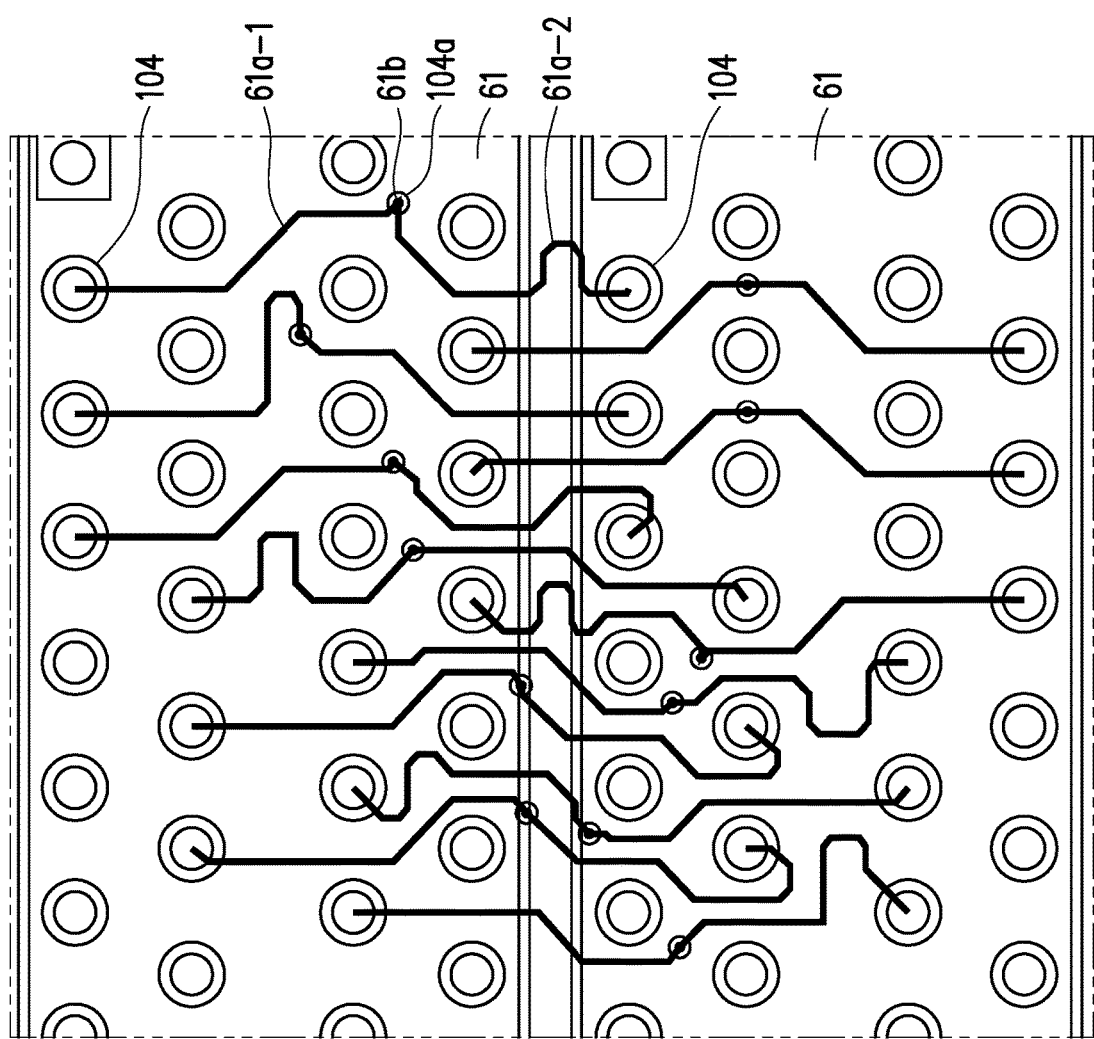
FIG. 7C shows wiring of an outer patterned conductive layer L1 of the wiring board of FIG. 7A.
Figure 7D:
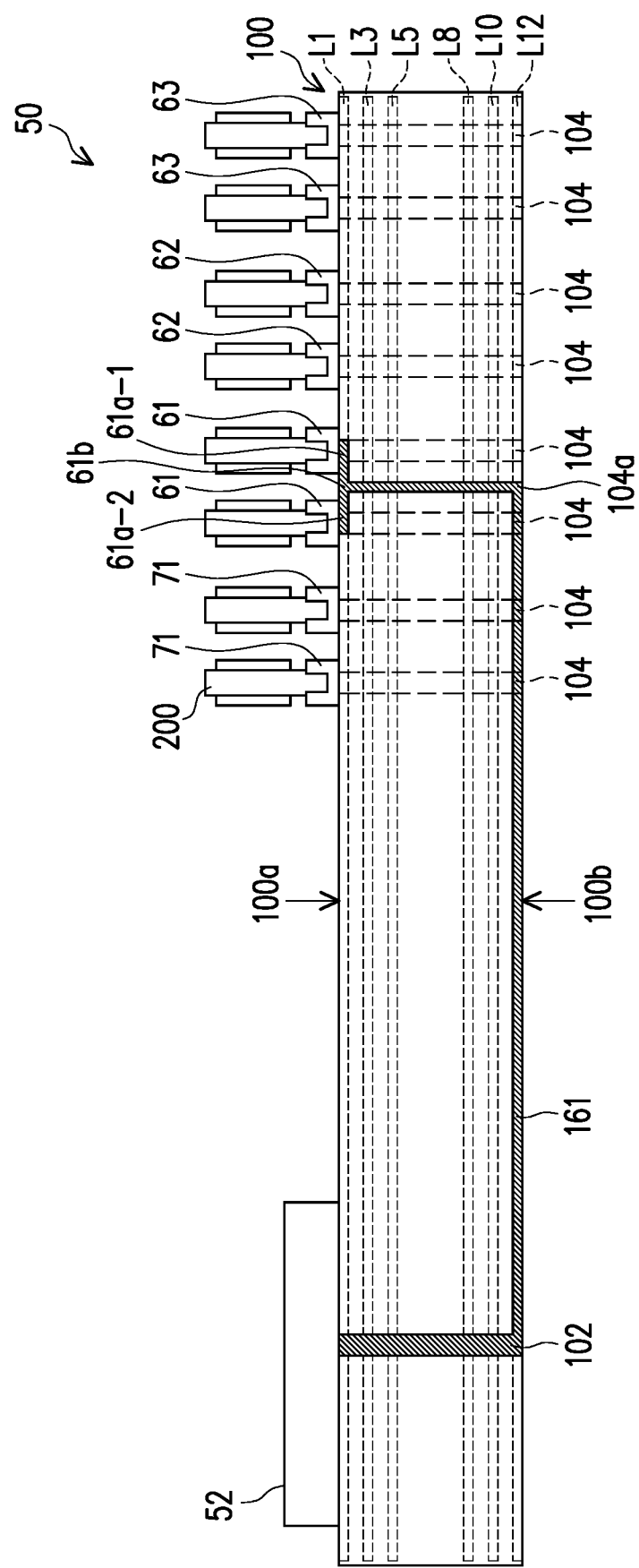
FIG. 7D is a schematic diagram of an electronic assembly according to another embodiment of the disclosure.

Referring to FIG. 7A, FIG. 7B and FIG. 7C, compared to the embodiment of FIG. 1A, in this embodiment, a first conductive path 161 extends from a control element 52 through a corresponding near conductive hole 102 to a corresponding inner patterned conductive layer L8, and through an additionally disposed corresponding far conductive hole 104a and an outer patterned conductive layer L1 to the pair of first internal electrical connectors 61. In other words, the first conductive path 161 achieves signal transmission through the inner patterned conductive layer L8 and the outer patterned conductive layer L1 (that is, two different patterned conductive layers). In this embodiment, a T-type topology is used in the first conductive path 161, that is, the first conductive path 161 extends through the corresponding far conductive hole 104a to the outer patterned conductive layer L1, then branches through the outer patterned conductive layer L1 and equidistantly extends to the pair of first internal electrical connectors 61. The additionally disposed far conductive hole 104a is disposed between the corresponding far conductive holes 104 (that is, conductive through holes for a pin) of the first internal electrical connector 61. It should be illustrated in detail that the pair of first internal electrical connectors 61 are electrically connected to each other at equidistant traces 61a-1 and 61a-2 on both sides of a branch point 61b (the far conductive hole 104a) of the outer patterned conductive layer L1, as shown in FIG. 7C. In addition, compared to FIG. 6B, an inner patterned conductive layer L8 of FIG. 7B is disposed between adjacent far conductive holes 104 without wiring. In addition, in other embodiments as shown in FIG. 7D, the wiring board 100 further includes a bottom surface 100b and a bottom patterned conductive layer (a second patterned conductive layer) L12 relative to the mounting surface 100a. Inner patterned conductive layers L3, L5, L8, L10 are located between the outer patterned conductive layer L1 and the bottom patterned conductive layer L12. The first conductive path 161 extends from the control element 52 through the corresponding near conductive hole 102 to the corresponding bottom patterned conductive layer L12, and through the corresponding far conductive hole 104a and the outer patterned conductive layer L1 to the pair of first internal electrical connectors 61, as shown in FIG. 7D. In other words, the first conductive path 161 achieves signal transmission through two different patterned conductive layers.

Figure 8:
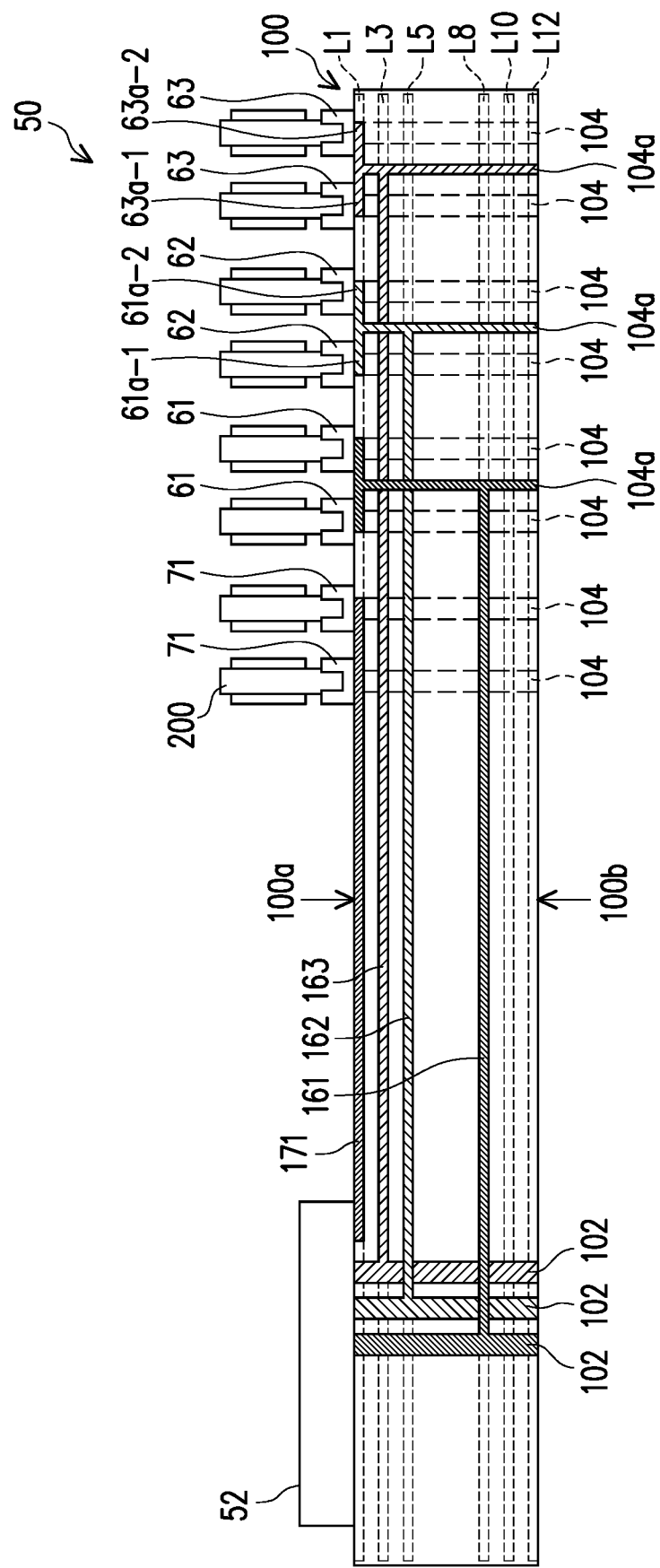
FIG. 8 is a schematic diagram of an electronic assembly according to still another embodiment of the disclosure.

Referring to FIG. 8, compared to the embodiment of FIG. 7A, in this embodiment, an electronic assembly 50 further includes a pair of second internal electrical connectors 62 mounted on a mounting surface 100a of a wiring board and adapted for mounting a pair of memory modules 200. The wiring board 100 further includes a second conductive path 162. The second conductive path 162 extends from a control element 52 through a corresponding near conductive hole 102 to a corresponding inner patterned conductive layer L5, and through an additionally disposed corresponding far conductive hole 104a and equidistant traces 62a-1, 62a-2 of an outer patterned conductive layer L1 to the pair of second internal electrical connector 62. The pair of second internal electrical connectors 62 are farther from a control element 52 than the pair of first internal electrical connectors 61. It should be noted that a corresponding inner patterned conductive layer L5 through which the second conductive path 162 passes is different from a corresponding inner patterned conductive layer L8 through which the first conductive path 161 passes.

In this embodiment, the corresponding inner patterned conductive layer L5 through which the second conductive path 162 passes is closer to the outer patterned conductive layer L1 than the corresponding inner patterned conductive layer L8 through which the first conductive path 161 passes. In other words, compared to the pair of first internal electrical connectors 61 closer to the control element 52, the pair of second internal electrical connectors 62 farther from the control element 52 have a greater tolerance to signal interference, and the second conductive path 162 corresponding to the pair of second internal electrical connectors may be disposed on the inner patterned conductive layer L5 closer to the outer patterned conductive layer L1.

In this embodiment, a T-type topology is also used in the second conductive path 162. The second conductive path 162 extends through the corresponding far conductive hole 104a to the outer patterned conductive layer L1, then branches through the outer patterned conductive layer L1 and extends to the pair of second internal electrical connectors 62 at the equidistant traces 62a-1 and 62a-2.

In this embodiment, the electronic assembly 50 further includes a pair of third internal electrical connectors 63 mounted on the mounting surface 100a of the wiring board and adapted for mounting a pair of memory modules 200. The wiring board 100 further includes a third conductive path 163. The third conductive path 163 extends from a control element 52 through a corresponding near conductive hole 102 to a corresponding inner patterned conductive layer L3, and through a corresponding far conductive hole 104a to the pair of third internal electrical connector 63 at equidistant traces 63a-1 and 63a-2 of an outer patterned conductive layer L1. The pair of third internal electrical connectors 63 are farther from the control element 52 than the pair of first internal electrical connectors 61.

In this embodiment, a corresponding inner patterned conductive layer L3 through which the third conductive path 163 passes is closer to the outer patterned conductive layer L1 than the inner patterned conductive layer L8 through which the first conductive path 161 passes and the corresponding inner patterned conductive layer L10 through which the second conductive path 162 passes. In other words, because a pair of internal electrical connectors (for example, the pair of third internal electrical connectors 63) farther from the control element 52 have a greater tolerance to signal interference, an conductive path corresponding to the pair of internal electrical connectors may be configured in an inner patterned conductive layer (for example, the inner patterned conductive layer L3) closer to the outer patterned conductive layer L1.

In this embodiment, a T-type topology is also used in the third conductive path 163. The third conductive path 163 extends through the corresponding far conductive hole 104a to the outer patterned conductive layer L1, then branches through the outer patterned conductive layer L1 and extends to the pair of third internal electrical connectors 63 at the equidistant traces 63a-1 and 63a-2.

In this embodiment, the electronic assembly 50 further includes a pair of external electrical connectors 71. The pair of external electrical connectors 71 are mounted on the mounting surface 100a of the wiring board, and is adapted for mounting a pair of memory modules 200. The wiring board 100 further includes an outer conductive path 171. The outer conductive path 171 extends from the control element 52 through the outer patterned conductive layer L1 to the pair of external electrical connectors 71. The pair of external electrical connectors 71 are closer to the control element 52 than the pair of first internal electrical connectors 61.

In this embodiment, a T-type topology is also used in the outer conductive path 171. The outer conductive path 171 extends through the outer patterned conductive layer L1 to one of the pair of external electrical connectors 71, and then through the outer patterned conductive layer L1 to the other of the pair of external electrical connectors 71.

Figure 9:
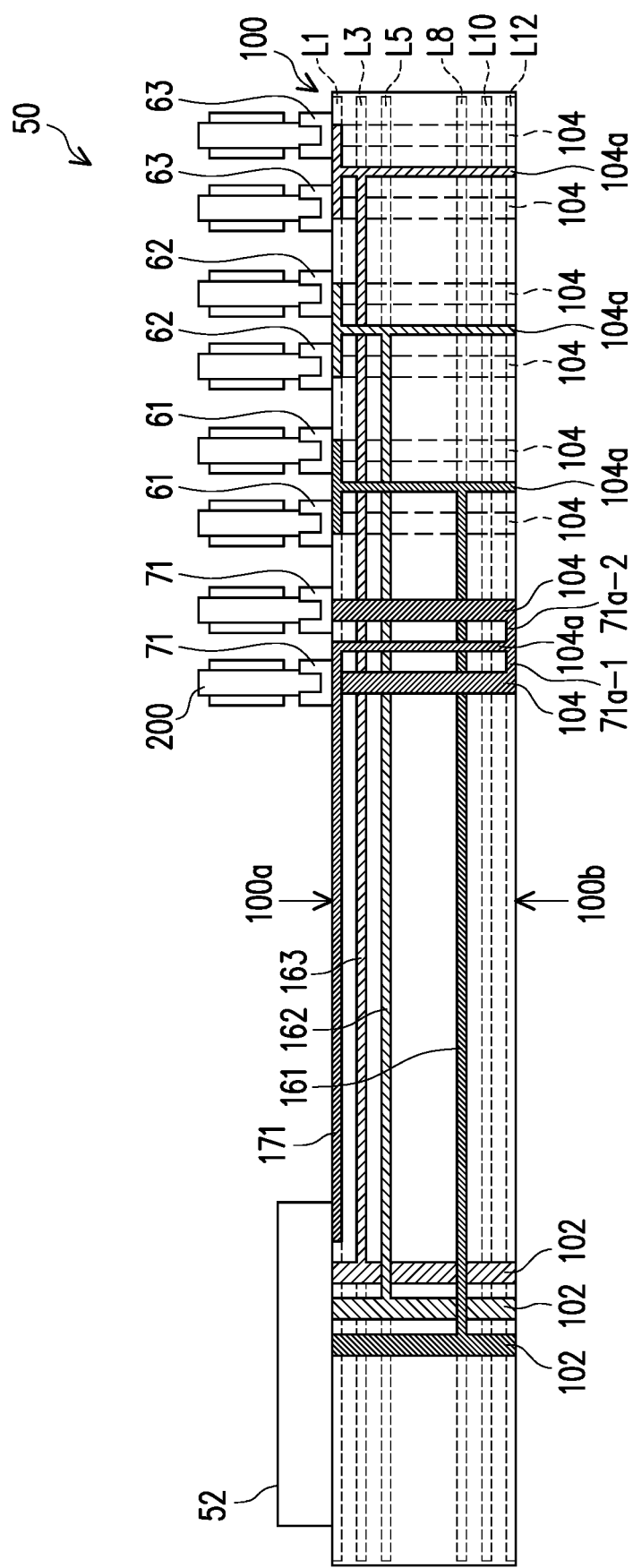
FIG. 9 is a schematic diagram of an electronic assembly according to yet another embodiment of the disclosure.

Referring to FIG. 9, compared to the embodiment of FIG. 8, in this embodiment, a wiring board 100 further includes a bottom surface 100b relative to a mounting surface 100a and a bottom patterned conductive layer L12. Inner patterned conductive layers L3, L5, L8, L10 are located between the outer patterned conductive layer L1 and the bottom patterned conductive layer L12. An outer conductive path 171 extends through an outer patterned conductive layer L1 to an additionally disposed corresponding far conductive hole 104a, through the corresponding far conductive hole 104a to the bottom patterned conductive layer L12, then branches through the bottom patterned conductive layer L12 and extends to a pair of the far conductive holes 104 (that is, conductive through holes for pins) at equidistant traces 71a-1 and 71a-2, and then extends through the pair of far conductive holes 104 to a pair of external electrical connectors 71, respectively.

Figure 10:
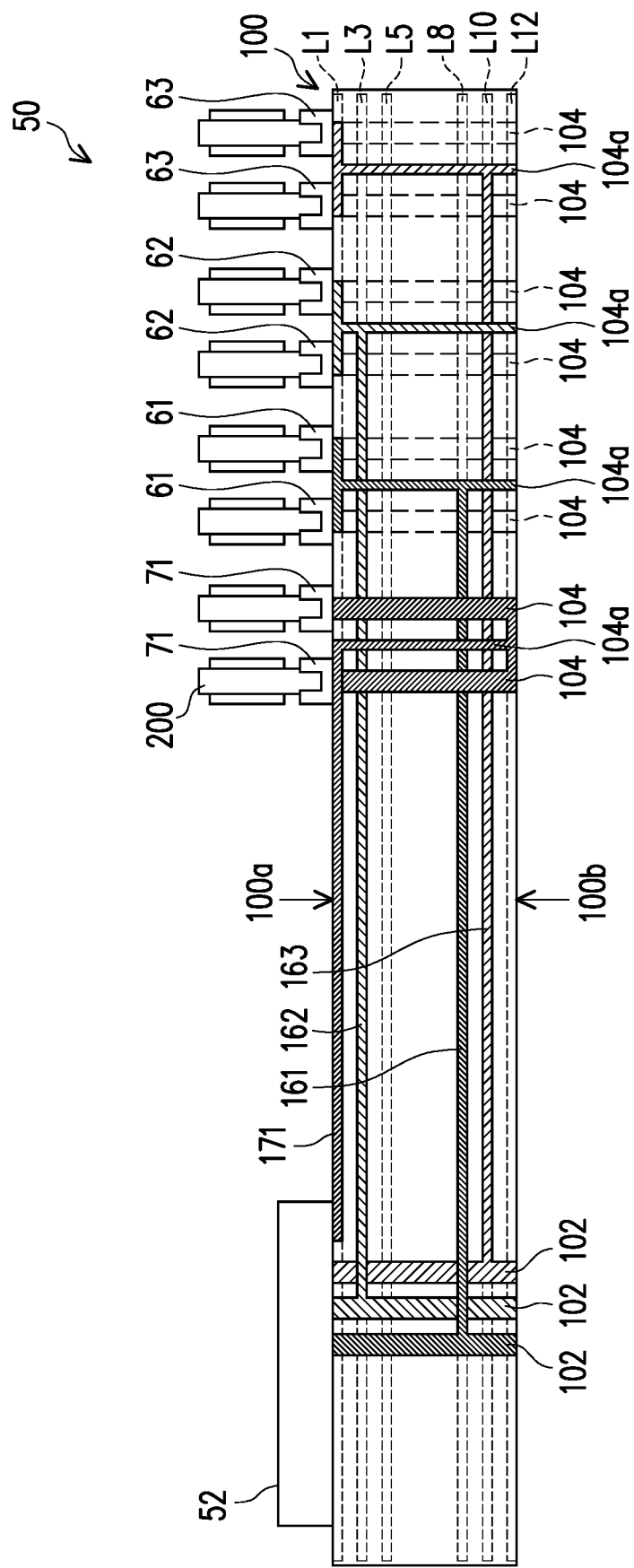
FIG. 10 is a schematic diagram of an electronic assembly according to yet still another embodiment of the disclosure.

Referring to FIG. 10, compared to the embodiment of FIG. 9, in this embodiment, a corresponding inner patterned conductive layer L3 through which a second conductive path 162 of a pair of second internal electrical connectors 62 passes is closer to an outer patterned conductive layer L1 than a corresponding inner patterned conductive layer L8 through which a first conductive path 161 passes. A corresponding inner patterned conductive layer L10 through which a third conductive path 163 of a pair of third internal electrical connectors 63 passes is farther from the outer patterned conductive layer L1 than a corresponding inner patterned conductive layer L8 through which a first conductive path 161 passes and a corresponding inner patterned conductive layer L3 through which the second conductive path 162 passes. Because the pair of second internal electrical connectors 62 and the pair of third internal electrical connectors 63 are farther from the control element 52 and have a greater tolerance to signal interference, in some cases, a number of the inner patterned conductive layers at which a conductive path thereof is located may be adjusted flexibly. However, compared to the pair of first internal electrical connectors 61 closer to the control element 52, a number of the inner patterned conductive layers at which a conductive path thereof is located needs to be farther from the outer patterned conductive layer L1.

In an embodiment not shown, conductive paths 161, 162, and 163 of a wiring board 100 may be wired in a way as shown in FIG. 10, and a conductive path 171 may be wired in a way as shown in FIG. 8 as data transmission (DQ) channels. In another embodiment not shown, conductive paths 161, 162, 163, and 171 of the wiring board 100 may be wired in a way as shown in FIG. 10 as signal capturing (DQS) channels.

In all of the foregoing embodiments, there may be a plurality of conductive paths (including the first conductive path 161, the second conductive path 162, the third conductive path 163, and the outer conductive path 171) in which the wiring board 100 extends to electrical connectors. In FIG. 1A, FIG. 2A, FIG. 4, FIG. 5, FIG. 6A, FIG. 7A, FIG. 8, FIG. 9, and FIG. 10, only one conductive path is used as a representative. In addition, the conductive paths may also be disposed in pairs to serve as a differential signal pair.

Based on the foregoing, in the foregoing embodiment of the disclosure, the conductive path extends through a patterned conductive layer, and then continuously extends through another different patterned conductive layer to improve elasticity of the wiring.

What is claimed is:

1. An electronic assembly, comprising:
    a wiring board having a mounting surface, a first patterned conductive layer connected to the mounting surface, a plurality of second patterned conductive layers arranged below the first patterned conductive layer, a plurality of near conductive holes, a plurality of far conductive holes, and a first conductive path, wherein the first patterned conductive layer is located between the mounting surface and the second patterned conductive layers;
    a control element mounted on the mounting surface of the wiring board; and
    a pair of first internal electrical connectors mounted on the mounting surface of the wiring board, connected to the first patterned conductive layer, and adapted for mounting a pair of memory modules, wherein
    the first conductive path extends from the control element at least though the corresponding second patterned conductive layer and the first patterned conductive layer to the pair of first internal electrical connectors,
    wherein each of the far conductive holes includes a pair of first far conductive holes corresponding to the pair of first internal electrical connectors, and an additionally-disposed far conductive hole disposed between the pair of first far conductive holes,
    the first conductive path extends through the additionally-disposed far conductive hole to the first patterned conductive layer.

2. The electronic assembly according to claim 1, wherein the first conductive path branches through the first patterned conductive layer, and equidistantly extends to the pair of first internal electrical connectors.

3. The electronic assembly according to claim 1, wherein the pair of first internal electrical connectors are electrically connected to each other through a pair of equidistant traces located on the first patterned conductive layer and extending from a branch point.

4. The electronic assembly according to claim 1, further comprising:
    a pair of second internal electrical connectors mounted on the mounting surface of the wiring board, and adapted for mounting a pair of memory modules, wherein
    the wiring board further has a second conductive path, the second conductive path extending from the control element through the corresponding near conductive hole to the corresponding second patterned conductive layer, and through the additionally-disposed far conductive hole of the corresponding far conductive hole and the first patterned conductive layer to the pair of second internal electrical connectors, the pair of second internal electrical connectors being farther from the control element than the pair of first internal electrical connectors, and the corresponding second patterned conductive layer through which the second conductive path passes being different from the corresponding second patterned conductive layer through which the first conductive path passes.

5. The electronic assembly according to claim 4, wherein the first conductive path branches through the first patterned conductive layer, and equidistantly extends to the pair of first internal electrical connectors, and the second conductive path extends through the additionally-disposed far conductive hole of the corresponding far conductive hole to the first patterned conductive layer, then branches through the first patterned conductive layer, and equidistantly extends to the pair of second internal electrical connectors.

6. The electronic assembly according to claim 1, further comprising:

a pair of second internal electrical connectors mounted on the mounting surface of the wiring board, and adapted for mounting a pair of memory modules, wherein the wiring board further has a second conductive path, the second conductive path extending from the control element through the corresponding near conductive hole to the corresponding second patterned conductive layer, and through the additionally-disposed far conductive hole of the corresponding far conductive hole and the first patterned conductive layer to the pair of second internal electrical connectors, the pair of second internal electrical connectors being farther from the control element than the pair of first internal electrical connectors, and the corresponding second patterned conductive layer through which the second conductive path passes being closer to the first patterned conductive layer than the corresponding second patterned conductive layer through which the first conductive path passes.

7. The electronic assembly according to claim 6, wherein the first conductive path branches through the first patterned conductive layer, and equidistantly extends to the pair of first internal electrical connectors, and the second conductive path extends through the additionally-disposed far conductive hole of the corresponding far conductive hole to the first patterned conductive layer, then branches through the first patterned conductive layer, and equidistantly extends to the pair of second internal electrical connectors.

8. The electronic assembly according to claim 6, further comprising:

a pair of third internal electrical connectors mounted on the mounting surface of the wiring board, and adapted for mounting a pair of memory modules, wherein the wiring board further has a third conductive path, the third conductive path extending from the control element through the corresponding near conductive hole to the corresponding second patterned conductive layer, and through the additionally-disposed far conductive hole of the corresponding far conductive hole and the first patterned conductive layer to the pair of third internal electrical connectors, the pair of third internal electrical connectors being farther from the control element than the pair of first internal electrical connectors, and the corresponding second patterned conductive layer through which the third conductive path passes being closer to the first patterned conductive layer than the corresponding second patterned conductive layer through which the second conductive path passes.

9. The electronic assembly according to claim 8, wherein the corresponding second patterned conductive layer through which the third conductive path passes being closer to the first patterned conductive layer than the corresponding second patterned conductive layer through which the first conductive path passes.

10. The electronic assembly according to claim 8, wherein the first conductive path branches through the first patterned conductive layer, and equidistantly extends to the pair of first internal electrical connectors, the second conductive path extends through the additionally-disposed far conductive hole of the corresponding far conductive hole to the first patterned conductive layer, then branches through the first patterned conductive layer, and equidistantly extends to the pair of second internal electrical connector, and the third conductive path extends through the additionally-disposed far conductive hole of the corresponding far conductive hole to the first patterned conductive layer, then branches through the first patterned conductive layer, and equidistantly extends to the pair of third internal electrical connectors.

11. The electronic assembly according to claim 6, further comprising:

a pair of third internal electrical connectors mounted on the mounting surface of the wiring board, and adapted for mounting a pair of memory modules, wherein the wiring board further has a third conductive path, the third conductive path extending from the control element through the corresponding near conductive hole to the corresponding second patterned conductive layer, and through the additionally-disposed far conductive hole of the corresponding far conductive hole and the first patterned conductive layer to the pair of third internal electrical connectors, the pair of third electrical connectors being farther from the control element than the pair of first internal electrical connectors, and the corresponding second patterned conductive layer through which the third conductive path passes being farther from the first patterned conductive layer than the corresponding second patterned conductive layer through which the second conductive path passes.

12. The electronic assembly according to claim 11, wherein the corresponding second patterned conductive layer through which the third conductive path passes is closer to the first patterned conductive layer than the corresponding second patterned conductive layer through which the first conductive path passes.

13. The electronic assembly according to claim 11, wherein the corresponding second patterned conductive layer through which the third conductive path passes is farther from the first patterned conductive layer than the corresponding second patterned conductive layer through which the first conductive path passes.

14. The electronic assembly according to claim 11, wherein
- the first conductive path branches through the first patterned conductive layer, and equidistantly extends to the pair of first internal electrical connectors,
- the second conductive path extends through the additionally-disposed far conductive hole of the corresponding far conductive hole to the first patterned conductive layer, then branches through the first patterned conductive layer, and equidistantly extends to the pair of second internal electrical connector, and
- the third conductive path extends through the additionally-disposed far conductive hole of the corresponding far conductive hole to the first patterned conductive layer, then branches through the first patterned conductive layer, and equidistantly extends to the pair of third internal electrical connectors.

15. The electronic assembly according to claim 1, further comprising:
- a pair of external electrical connectors mounted on the mounting surface of the wiring board, and adapted for mounting a pair of memory modules, wherein
- the wiring board further has an outer conductive path,
- the outer conductive path extending from the control element through the first patterned conductive layer to the pair of external electrical connectors, and
- the pair of external electrical connectors are closer to the control element than the pair of first internal electrical connectors.

16. The electronic assembly according to claim 15, wherein
- the outer conductive path extends through the first patterned conductive layer to a center of the pair of external electrical connectors, then branches through the first patterned conductive layer, and equidistantly extends to the pair of external electrical connectors.

17. The electronic assembly according to claim 15, wherein
- the wiring board further has a bottom surface relative to the mounting surface and a bottom patterned conductive layer,
- the second patterned conductive layers being located between the first patterned conductive layer and the bottom patterned conductive layer, and
- the outer conductive path extending through the first patterned conductive layer to the additionally-disposed far conductive hole of the corresponding far conductive hole, and through the additionally-disposed far conductive hole to the bottom patterned conductive layer, branching through the bottom patterned conductive layer, equidistantly extending to the pair of the first far conductive holes, and extending through the pair of first far conductive holes to the pair of external electrical connectors, respectively.

18. The electronic assembly according to claim 1, wherein the first patterned conductive layer comprises an outer patterned conductive layer, and the second patterned conductive layers comprise an inner patterned conductive layer and a bottom patterned conductive layer.

* * * * *